United States Patent
Xu

(10) Patent No.: US 10,236,288 B2
(45) Date of Patent: Mar. 19, 2019

(54) INTEGRATED ON-CHIP JUNCTION CAPACITOR FOR POWER MANAGEMENT INTEGRATED CIRCUIT DEVICE

(71) Applicant: CoolStar Technology, Inc., Sunnyvale, CA (US)

(72) Inventor: Shuming Xu, Sunnyvale, CA (US)

(73) Assignee: COOLSTAR TECHNOLOGY, INC., Santa Clara, CA (US)

(*) Notice: Subject to any disclaimer, the term of this patent is extended or adjusted under 35 U.S.C. 154(b) by 0 days.

(21) Appl. No.: 15/141,816

(22) Filed: Apr. 28, 2016

(65) Prior Publication Data

US 2016/0322349 A1    Nov. 3, 2016

Related U.S. Application Data

(60) Provisional application No. 62/153,986, filed on Apr. 28, 2015.

(51) Int. Cl.
| | | |
|---|---|---|
| *H01L 29/93* | (2006.01) | |
| *H01L 27/06* | (2006.01) | |
| *H01L 49/02* | (2006.01) | |
| *H01L 29/06* | (2006.01) | |
| *H01L 21/8234* | (2006.01) | |
| *H01L 29/94* | (2006.01) | |
| *H01L 29/78* | (2006.01) | |
| *H01L 29/66* | (2006.01) | |

(52) U.S. Cl.
CPC ...... *H01L 27/0629* (2013.01); *H01L 21/8234* (2013.01); *H01L 28/60* (2013.01); *H01L 28/90* (2013.01); *H01L 29/0688* (2013.01); *H01L 29/94* (2013.01); *H01L 29/945* (2013.01); *H01L 29/66659* (2013.01); *H01L 29/7835* (2013.01); *H01L 29/93* (2013.01)

(58) Field of Classification Search
CPC .... H01L 29/66674–29/66734; H01L 27/0629; H01L 21/8234; H01L 29/0688; H01L 29/7816; H01L 29/66681; H01L 29/66174; H01L 21/761; H01L 21/8238; H01L 27/0248; H01L 27/0266; H01L 28/40–28/92; H01L 7/00; H01L 27/08–27/0811; H01L 29/92–29/945; H03F 1/52; H02M 3/07

See application file for complete search history.

(56) References Cited

U.S. PATENT DOCUMENTS

| | | | |
|---|---|---|---|
| 4,754,310 A | | 6/1988 | Coe |
| 5,604,655 A | * | 2/1997 | Ito ...................... H01L 27/0266 361/111 |
| 5,929,478 A | * | 7/1999 | Parris .................... H01L 27/115 257/314 |

(Continued)

*Primary Examiner* — Eric A. Ward
*Assistant Examiner* — Eric K Ashbahian
(74) *Attorney, Agent, or Firm* — Hoffmann & Baron, LLP

(57) ABSTRACT

A power semiconductor device includes a substrate of a first conductivity type, a buried layer of a second conductivity type formed in at least a portion of the substrate, and at least one epitaxial layer of the first conductivity type formed on at least a portion of an upper surface of the substrate and covering the buried layer. The epitaxial layer and the buried layer form a junction capacitor. The device further includes at least one active power transistor formed in an upper surface of the epitaxial layer and above at least a portion of the buried layer.

22 Claims, 5 Drawing Sheets

(56) References Cited

U.S. PATENT DOCUMENTS

| | | | |
|---|---|---|---|
| 6,096,656 | A | 8/2000 | Matzke et al. |
| 6,184,064 | B1 | 2/2001 | Jiang et al. |
| 6,399,990 | B1 * | 6/2002 | Brennan ............. H01L 27/0266 |
| | | | 257/355 |
| 6,624,487 | B1 * | 9/2003 | Kunz .................. H01L 27/0266 |
| | | | 257/355 |
| 6,825,080 | B1 * | 11/2004 | Yang ....................... H01L 28/90 |
| | | | 257/301 |
| 8,072,044 | B2 | 12/2011 | Gruenhagen et al. |
| 8,222,118 | B2 | 7/2012 | Dydyk et al. |
| 2005/0194653 | A1 * | 9/2005 | Hynecek ................ H04N 9/045 |
| | | | 257/443 |
| 2007/0131991 | A1 * | 6/2007 | Sugawa ............ H01L 27/14603 |
| | | | 257/292 |
| 2013/0105904 | A1 * | 5/2013 | Roybal ........... H01L 21/823892 |
| | | | 257/369 |
| 2015/0014771 | A1 * | 1/2015 | Brochu, Jr. ......... H01L 29/7833 |
| | | | 257/343 |

* cited by examiner

INTEGRATED ON-CHIP JUNCTION CAPACITOR FOR POWER MANAGEMENT INTEGRATED CIRCUIT DEVICE

CROSS-REFERENCE TO RELATED APPLICATIONS

This patent application claims the benefit of U.S. Provisional Patent Application Ser. No. 62/153,986 filed on Apr. 28, 2015, entitled "Integrated On-Chip Junction Capacitor for Power Management IC Device," the complete disclosure of which is expressly incorporated herein by reference in its entirety for all purposes.

FIELD

The present invention relates generally to integrated circuit (IC) structures, and more particularly to semiconductor structures and methods for monolithically integrated power management devices.

BACKGROUND

As the demand for the telecommunications/server power grows exponentially, the need for higher power density IC devices and power management devices increases each year. Increasing power density relies on less component counts, smaller reactive component size, and/or better system efficiency, among other factors. For a switched mode power supply, higher switching frequency leads to smaller reactive and filter component sizes. Better efficiency, which reduces the size of and/or need for a heat sink or paralleled devices, requires a reduction in conduction losses and/or switching losses.

The use of high-frequency power management in an IC improves power density and reduces form factor, and is thus desirable. In one illustrative application, high-frequency power conversion increases a transit rate which thereby facilitates dynamic scaling of the input power for the load based on the needs of the load. This can reduce power consumption of the load by up to fifty percent.

To increase the switching frequency, high-speed power devices (e.g., greater than about 500 MHz) are generally required. Operating at high frequencies in a power converter is often limited by series inductance in the loop and the reverse recovery behavior of the power switching device used. For example, when a high-speed power device is operating at a high switching speed in a DC-to-DC converter, reverse recovery charge ($Q_{rr}$) of a low-side power metal-oxide-semiconductor field-effect transistor (MOSFET) will cause high ringing voltages at a switching node in the circuit. One conventional approach to accommodate the high ringing voltage of the switching node is to use a device with high breakdown voltage (BV). However, the high breakdown voltage device will, in general, deteriorate the performance, increase device area, and increase the cost for the device.

There have been various attempts to reduce the switching node ringing voltage. One way to reduce the switching node ringing voltage is to slow down the turn-on speed of a high-side MOSFET. However, doing so will increase the turn-on duration and increase turn-on loss which, in turn, will deteriorate the efficiency of the power conversion and defeat the purpose of the high-frequency switch. Another way of reducing the ringing voltage is to decrease the $Q_{rr}$ of a low-side MOSFET by reducing the p-type body doping concentration in the device, which can lower the threshold of the MOSFET and allow the channel to flow more current during the dead time. However, having a lower p-body doping level makes the device more susceptible to a parasitic bipolar transistor being triggered, thereby causing a failure in the power system.

SUMMARY

One or more embodiments of the present invention provide enhanced techniques for improving high-frequency performance in a power conversion application. Specifically, aspects of the present disclosure provide methods and devices for on-chip integration of a junction capacitor with a power management IC device.

In accordance with an embodiment of the invention, a power semiconductor device includes a substrate of a first conductivity type, a buried layer of a second conductivity type formed in at least a portion of the substrate, and at least one epitaxial layer of the first conductivity type formed on at least a portion of an upper surface of the substrate and covering the buried layer. The epitaxial layer and the buried layer, together, form a junction capacitor. The device further includes at least one active power transistor formed in an upper surface of the epitaxial layer and above at least a portion of the buried layer. Optionally, in one or more embodiments, the buried layer is formed as a trenched structure so as to increase an effective area of a P/N junction formed between the buried layer and the epitaxial layer, and thereby increase a capacitance density (i.e., capacitance per unit area) of the integrated capacitor.

Techniques according to embodiments of the present invention provide substantial beneficial technical effects. By way of example only and without limitation, one or more embodiments provide techniques for integrating an on-chip capacitance with a power transistor device which includes one or more of the following advantages, among other benefits:

reducing switching node ringing voltage;
expanding device operation frequency range, which leads to higher power efficiency; and
smaller form factor compared to non-integrated capacitors or capacitors formed using other schemes.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
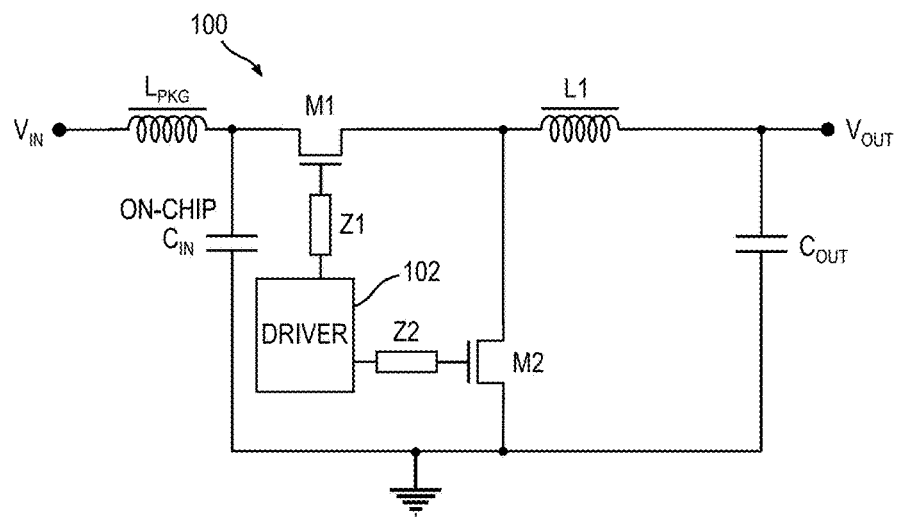
FIG. 1 is a schematic diagram depicting at least a portion of an exemplary circuit which shows one way of suppressing ringing voltage at a switching node in a power conversion application.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of exemplary devices and methods for improving high-frequency performance in a power conversion application. It is to be appreciated, however, that the invention is not limited to the specific circuits and/or methods illustratively shown and described herein. Rather, aspects of the present disclosure relate more broadly to techniques for on-chip integration of a junction capacitor with a power management IC device. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET, as may be used herein, is intended to be construed broadly and to encompass any type of metal-insulator-semiconductor field-effect transistor. The term MISFET is, for example, intended to encompass semiconductor field-effect transistors that utilize an oxide material as their gate dielectric (i.e., metal-oxide-semiconductor field-effect transistors (MOSFETs)), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal such as, for instance, polysilicon; the terms "MISFET" and "MOSFET" are used interchangeably herein.

Although the overall fabrication method and structures formed thereby in accordance with embodiments of the invention are entirely novel, certain individual processing steps required to implement a portion or portions of the method may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

As previously stated, there have been various techniques used to reduce switching node ringing voltage in an attempt to improve high-frequency performance in a power conversion application, all having limited success. FIG. 1 is a schematic diagram depicting at least a portion of an exemplary circuit 100 which shows one way of suppressing ringing voltage at a switching node in a power conversion application. As shown in FIG. 1, this approach involves integrating an on-chip capacitor, $C_{IN}$, with an input terminal, $V_{IN}$, of a control MOSFET (high-side FET) M1. Also shown in the circuit 100 is a synchronous MOSFET (low-side FET) M2 having a drain connected with a source of the high-side FET M1, an inductor, L1, connected in series between the source of M1 and an output terminal, $V_{OUT}$, of the circuit, and an output capacitor, $C_{OUT}$, connected between the output terminal $V_{OUT}$ and ground. The MOSFETs M1 and M2 can be N-type (i.e., NMOS) or P-type (i.e., PMOS), and they need not be of the same type. A parasitic impedance attributable to packaging inductance is represented by an inductor, $L_{PKG}$, connected in series between the input terminal $V_{IN}$ and a drain of the high-side device M1. A driver circuit 102 is connected to gates of the high-side and low-side FETs M1 and M2, respectively, and is configured to control a switching of M1 and M2 to thereby control the voltage at the output terminal $V_{OUT}$. Also shown in FIG. 1 are parasitic impedance impedances, Z1 and Z2, associated with the gates of FETs M1 and M2, respectively.

Figure 2:
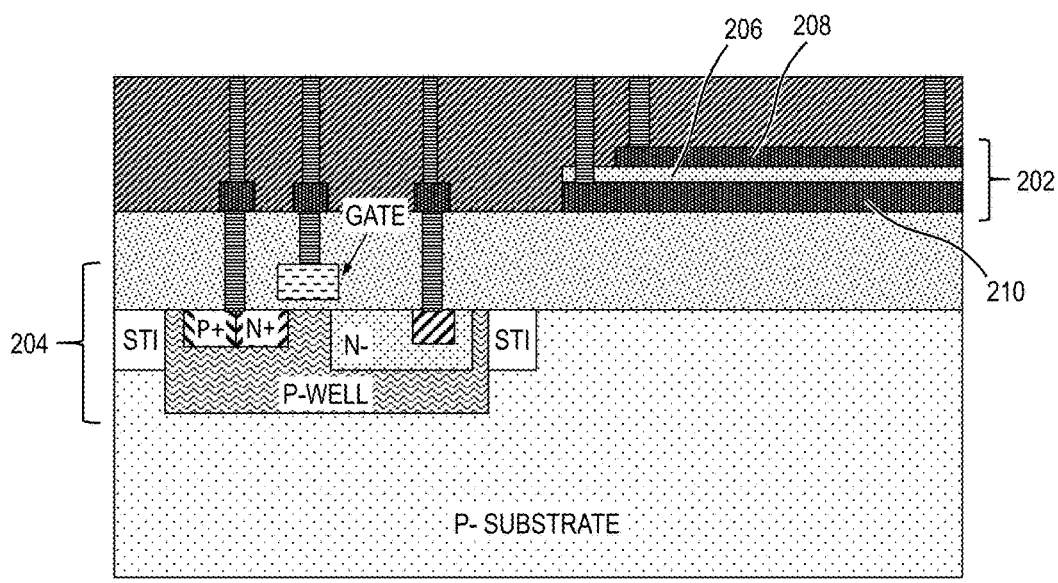
FIG. 2 is a cross-sectional view conceptually depicting the integration of a metal-insulator-metal (MIM) capacitor with a power MOSFET device.

There are several methods of integrating an on-chip capacitor with power devices. For example, FIG. 2 is a cross-sectional view conceptually depicting the integration of a standard metal-insulator-metal (MIM) capacitor 202 with a power MOSFET device 204. The power MOSFET device 204 can be formed in a conventional manner. The MIM capacitor 202, which includes a dielectric layer 206 sandwiched between two metal conducting layers, 208 and 210, representing top and bottom plates, respectively, of the capacitor, is fabricated during IC device metallization (e.g., metal routing) processing after the formation of the power MOSFET device 204.

Figure 3:
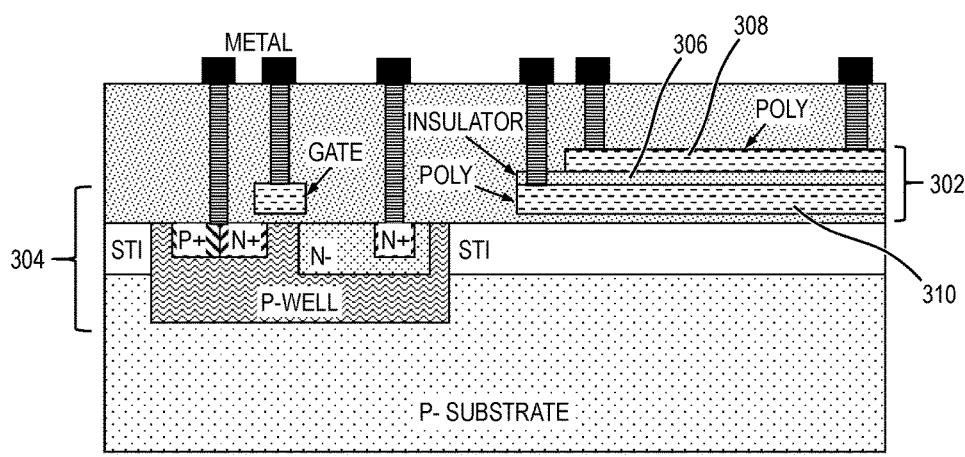
FIG. 3 conceptually depicts the integration of a polysilicon-insulator-polysilicon (PIP) capacitor with a power MOSFET device.

Similar to the MIM capacitor 202 shown in FIG. 2, a polysilicon-insulator-polysilicon (PIP) capacitor 302 can be fabricated using two polysilicon (poly) films, as shown in the cross-sectional view of FIG. 3. Specifically, FIG. 3 conceptually depicts the integration of a PIP capacitor 302 with a power MOSFET device 304. The power MOSFET device 304 can be formed in a conventional manner. Like the MIM capacitor shown in FIG. 2, the PIP capacitor 302, which includes a dielectric layer 306 sandwiched between two heavily-doped poly film layers, 308 and 310, representing the top and bottom plates, respectively, of the capacitor, is fabricated after the formation of the power MOSFET device 304.

The capacitance density of MIM or PIP capacitors depends primarily on characteristics of the dielectric material separating the top and bottom plates, such as dielectric constant and thickness. One drawback of either of the MIM or PIP capacitor schemes is that it is difficult to fabricate high capacitance density capacitors due, at least in part, to the limited selection of dielectric materials that are compatible with the overall IC processing technology, as well as dielectric voltage breakdown requirements. Another drawback of MIM and PIP capacitors is that they consume significant die area to produce a capacitor having a suitable capacitance value, which increases the die cost.

Figure 4:
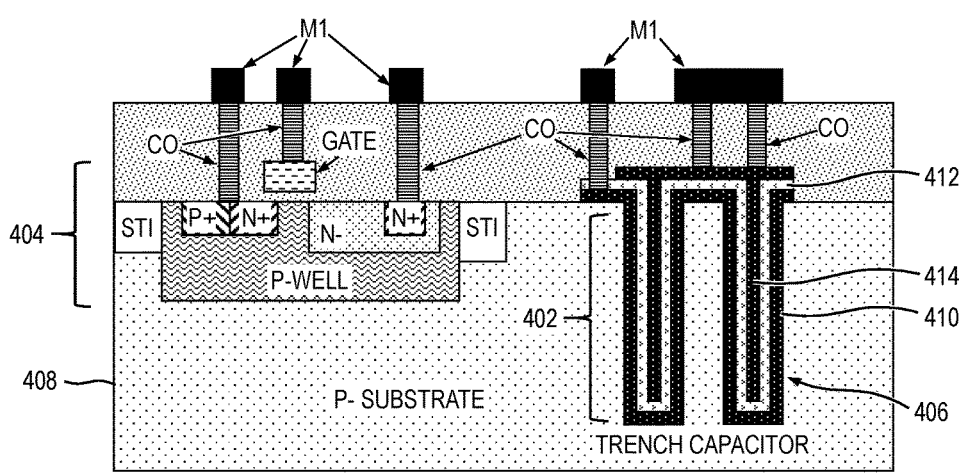
FIG. 4 is a cross-sectional view conceptually depicting the integration of a silicon trench capacitor with a power MOSFET device.

In another approach, FIG. 4 is a cross-sectional view conceptually depicting the integration of a silicon trench capacitor 402 with a power MOSFET device 404. The power MOSFET device 404 can be formed in a conventional manner. The trench capacitor 402 is fabricated by forming one or more trenches 406 in a substrate 408 of a semiconductor device. In this embodiment, the substrate 408 comprises a p-type silicon substrate, although other types of substrates are similarly contemplated, as will become apparent to those skilled in the art. A first conductive layer 410, which will be a bottom plate of the resulting capacitor 402, is formed on sidewalls and a bottom of the trenches 406, such as by using a deposition technique (e.g., chemical vapor deposition (CVD), atomic layer deposition (ALD), thin film deposition, or the like). A dielectric (i.e., insulting) layer 412, such as, for example, silicon dioxide, is formed on the first conductive layer 410. The dielectric layer may be formed, in one or more embodiments, by oxide growth, although alternative methods of forming the dielectric layer 412 can be similarly employed. A second conductive layer 414 is then formed on the dielectric layer 412. In this manner, a conductor-insulator-conductor capacitor is fabricated in the silicon substrate trenches 406 before the formation of the power MOSFET device 404. One advantage of the trench capacitor approach shown in FIG. 4 is that it is able to achieve relatively high capacitance density per unit silicon surface area, depending on the trench depth and trench pitch fabrication capability (the deeper the trenches and tighter the pitch, the greater the capacitance density). Like MIM or PIP capacitors, however, one drawback of trench capacitors is that they may still consume a significant silicon area, which increases cost. Another drawback of this method is that it requires at least three additional mask steps to fabricate the trench capacitor, which further adds to the manufacturing cost.

Aspects of the present invention, according to embodiments thereof, address one or more disadvantages associated with the above-noted methodologies by providing novel methods and semiconductor structures for integrating an on-chip capacitor with power converter circuitry to suppress switching node ringing voltage, and thereby improve an efficiency of a power conversion system. As will be described in conjunction with FIGS. 5A and 5B, embodiments utilize an N-type buried layer to form a P/N junction capacitor. Advantageously, the P/N junction capacitor is formed beneath one or more MOSFET devices, and so the capacitor does not significantly add to the overall die area that is required since this area is already being used to form the active devices. The respective doping levels of the N-type buried layer and P-type epitaxial layer used to form the P/N junction capacitor can be beneficially adjusted in such way that capacitance is maximized while maintaining a sufficient breakdown voltage for providing a desired clamping voltage to protect the MOSFET devices.

Figure 5A:
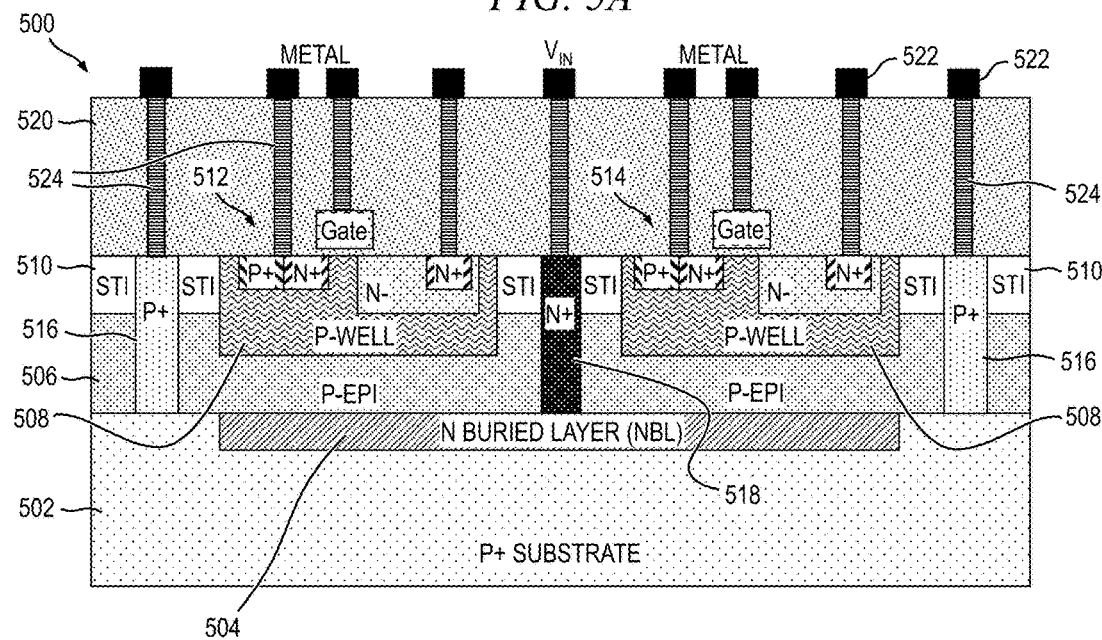
FIG. 5A is a cross-sectional view depicting at least a portion of an exemplary semiconductor structure which integrates an on-chip capacitor with MOSFET devices, according to an embodiment of the invention.

With reference now to FIG. 5A, a cross-sectional view depicts at least a portion of a semiconductor structure 500 which integrates an on-chip capacitor with MOSFET devices, according to an embodiment of the invention. Specifically, the semiconductor structure 500 include a substrate 502. The substrate 502, in one or more embodiments, is formed of single-crystalline silicon (e.g., having a <100> or <111> crystal orientation), although suitable alternative materials may also be used, such as, but not limited to, germanium, silicon germanium, silicon carbide, gallium arsenide, gallium nitride, or the like. Additionally, in one or more embodiments the substrate 502 is preferably modified by adding an impurity or dopant (e.g., boron, phosphorus, arsenic, etc.) to change a conductivity of the material (e.g., N-type or P-type). In one or more embodiments, the substrate 502 is of P-type conductivity and may thus be referred to as a P+ substrate (P+SUB). A P+ substrate may be formed by adding a P-type impurity or dopant (e.g., Group III elements, such as boron) of a prescribed concentration level (e.g., about $10^{14}$ to $10^{19}$ atoms per cubic centimeter) to the substrate material, such as by using a diffusion or implant step, to change the conductivity of the material as desired. In one or more alternative embodiments, an N-substrate may be formed by adding an N-type impurity or dopant (e.g., Group V elements, such as phosphorus) of a prescribed concentration level to the substrate material. One or more embodiments utilize a heavily-doped substrate such that the resistivity is below a prescribed value (e.g., on the order of about 0.1 Ω-cm or lower); the higher the impurity doping level, the lower the resistivity, and vice versa.

A buried layer 504 is formed in the substrate 502. In this embodiment, the buried is of N-type conductivity, formed by adding an N-type impurity or dopant (e.g., phosphorus (P-31), arsenic (As), antimony (Sb), etc.) into a defined region of the substrate such as by implantation, diffusion, or the like. The buried layer 504 may be referred to herein as an N-buried layer (NBL).

An epitaxial layer 506 is formed on at least a portion of an upper surface of the substrate 502 covering the buried layer 504. In the illustrative embodiment shown, a P-type epitaxial layer (P-Epi) is formed, such as, for example, by performing an epitaxial growth process and then implanting a P-type impurity or dopant (e.g., boron (B), gallium (Ga), etc.) into the epitaxial layer to adjust the doping level as desired. The P-type epitaxial layer 506 in conjunction with the N-buried layer 504 forms an on-chip integrated P/N junction capacitor which is used to improve the high-frequency performance of a power conversion system in which the semiconductor structure 500 is employed. As previously stated, the respective doping levels of the N-type buried layer 504 and P-type epitaxial layer 506 used to fabricate the P/N junction capacitor are adjusted (i.e., "tuned") so as to maximize the capacitance of the P/N junction capacitor and without significantly affecting other properties of the MOSFET devices, such as, but not limited to, breakdown voltage and transistor isolation. It is to be appreciated that a P/N junction is also formed between the N-type buried layer 504 and the P-type substrate 502, although the doping level of the substrate is generally too low to form a capacitor of any significant value.

In one or more embodiments, the epitaxial layer 506 may be comprised of multiple epitaxial layers (not explicitly shown, but implied). For example, the epitaxial layer 506 may include a first epitaxial layer, a second epitaxial layer formed on the first epitaxial layer and a third epitaxial layer formed on the second epitaxial layer. The first and third epitaxial layers may be formed of the same conductivity type (e.g., P-type) and the second epitaxial layer may be formed having a conductivity type (e.g., N-type) that is opposite that of the first and third epitaxial layers. The respective doping levels of the first and third epitaxial layers may be different; for example, the first epitaxial layer can be formed having a higher doping level relative to the third epitaxial level. Embodiments of the invention are not limited to the number and/or type of epitaxial layers forming the epitaxial layer 506.

After formation of the P/N junction capacitor, active power devices (e.g., MOSFETs) are formed in the semiconductor structure 500, according to one or more embodiments. With continued referenced to FIG. 5A, P-type wells (or P-wells) 508 are formed in the epitaxial layer 506 with a desired doping level for the MOSFET device by implanting dopant through a patterning mask (photoresist (PR) mask), proximate an upper surface of the epitaxial layer and above the buried layer 504. An active MOSFET device will be formed in each of the wells 508. Although P-type wells are shown in FIG. 5A, it is to be understood that the conductivity type of the wells may be different depending on the type of transistor being formed. For example, an N-type well may be used to form a PMOS transistor device, as will become apparent to those skilled in the art.

A plurality of shallow trench isolation (STI) structures 510 are formed in the epitaxial layer 506, proximate the upper surface of the epitaxial layer, for electrically isolating prescribed portions of the semiconductor structure 500. As is well known by those skilled in the art, STI structures are created at an early stage during the semiconductor device fabrication process, before transistors are formed. The main steps of an STI process involve forming trenches in an upper surface of the epitaxial layer 506, using, for example, standard lithographic patterning and etching, followed by depositing one or more dielectric materials (e.g., silicon dioxide) to fill the trenches, and then removing excess dielectric material using a planarization technique, such as, for example, chemical-mechanical planarization/polishing (CMP). Once the STI structures 510 have been defined, transistors, 512 and 514, are formed in the wells 508 between adjacent STI structures in a conventional manner.

Electrically conductive regions, referred to herein as sinkers 516 and 518, are formed in the semiconductor structure 500 at least partially through the epitaxial layer 506. The sinkers 516, 518 are used for making electrical connection with the epitaxial layer 506, functioning as a P-side of the P/N junction capacitor, and the buried layer 504, functioning as an N-side of the capacitor, respectively. Specifically, in one or more embodiments, at least one N-type (N+) sinker 518 for electrically contacting the N-type buried layer 504 is created by implanting a high dose (e.g., about 1e19 to 1e21) of N-type dopant with a trench- or column-shaped pattern into the epitaxial layer 506 and then, after diffusion at high temperature (e.g., about 850 degrees Celsius (° C.) to 1200° C.), to connect the underlying buried layer. Likewise, one or more P-type (P+) sinkers 516 for electrically contacting the P-type epitaxial layer 506 are formed by implanting a high dose of P-type dopant with a trench- or column-shaped pattern at least partially through the epitaxial layer, and then annealing at high temperature.

Alternatively, the N-type (N+) sinker 518 can be fabricated by forming a trench or other opening through the epitaxial layer 506 to expose the underlying buried layer, and then depositing one or more conductive materials (e.g., N-type polysilicon or metal such as tungsten) to fill the trench. Likewise, one or more P-type (P+) sinkers 516 for electrically contacting the P-type epitaxial layer 506 are created by forming trenches or other openings at least partially through the epitaxial layer, and then depositing one or more conductive materials (e.g., P-type polysilicon or metal such as tungsten) to fill the trenches. The trenches used to fabricate the sinkers 516, 518 may be formed using a standard patterning and etching process. It is to be understood that the invention is not limited to the particular number of sinkers used to electrically contact the corresponding capacitor terminals in the semiconductor structure 500.

The P+ sinkers 516 are electrically connected to both the P-type epitaxial layer (P-EPI) 506 and the underlying substrate 502, so as to connect the two P/N junctions on both sides of the buried layer (NBL) 504. Similarly, in one or more embodiments, multiple epitaxial layers of alternating doping (i.e., conductivity) type can be stacked in such a way as to form multiple P/N junction stacks to thereby further increase the junction capacitance density.

Figure 5B:
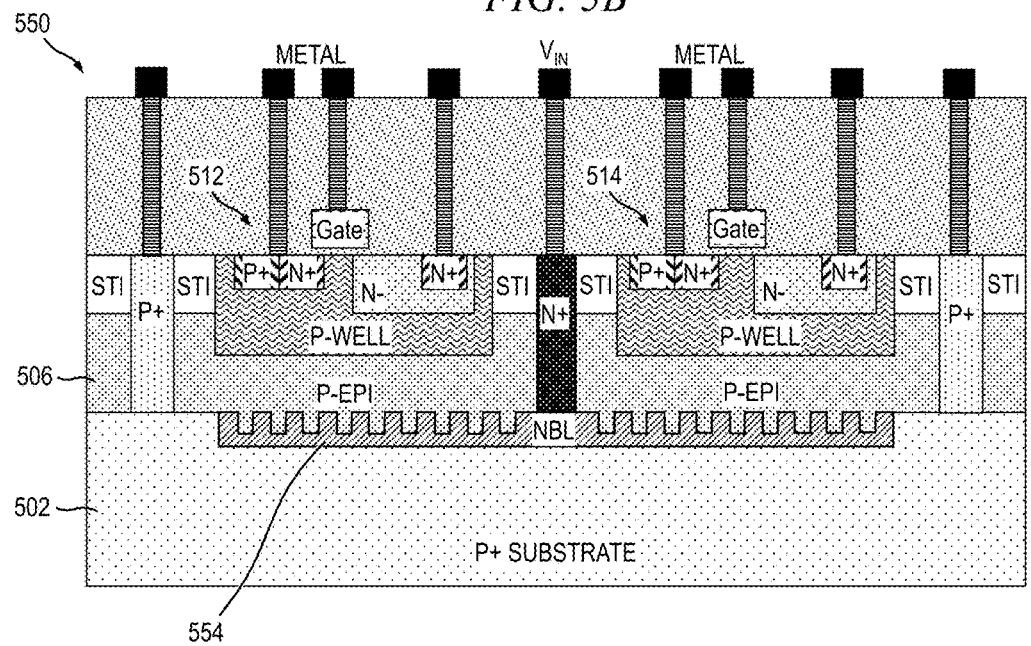
FIG. 5B is a cross-sectional view depicting at least a portion of an exemplary semiconductor structure which integrates an on-chip capacitor with MOSFET devices, according to another embodiment of the invention.

FIG. 5B is a cross-sectional view depicting at least a portion of an exemplary semiconductor structure 550 which integrates an on-chip capacitor with MOSFET devices, according to another embodiment of the invention. The semiconductor structure 550 is formed in a manner similar to the illustrative semiconductor structure 500 shown in FIG. 5A, except for the formation of the buried layer serving as the N-side of the P/N junction capacitor. Specifically, the semiconductor structure 550 includes a trenched buried layer 554 formed in an upper surface of the substrate 502, beneath the active power MOSFETs 512, 514, which serves as the N-side of the P/N junction capacitor; like the semiconductor structure 500, the epitaxial layer 506 serves as the P-side of the capacitor. Forming the buried layer 554 as a trenched structure beneficially increases the effective length of the P/N junction formed between the N-type buried layer 554 and the P-type epitaxial layer 506, thereby resulting in an increased capacitance density (i.e., capacitance per unit die area).

Figure 6A:
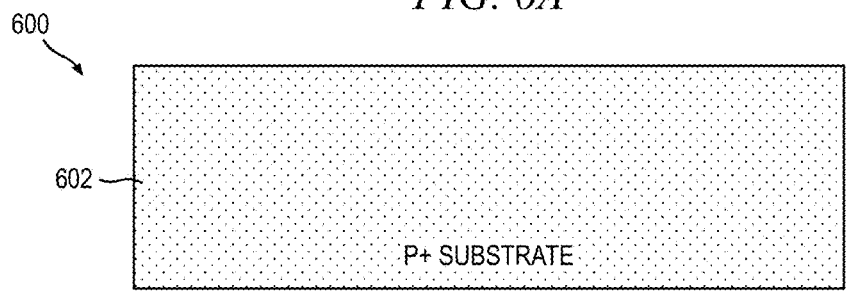
FIGS. 6A through 6E are cross-sectional views depicting intermediate processing steps in an overall semiconductor fabrication methodology for forming a P/N junction capacitor capable of on-chip integration with an active power semiconductor device, according to an embodiment of the invention.

FIGS. 6A through 6E are cross-sectional views depicting intermediate processing steps in an overall semiconductor fabrication methodology for forming an exemplary P/N junction capacitor 600 capable of on-chip integration with an active power semiconductor device, according to an embodiment of the invention. With reference to FIG. 6A, the capacitor starts with a P-type wafer or substrate 602. Consistent with the substrate 502 shown in FIG. 5A, the substrate 602, in one or more embodiments, is formed of single-crystalline silicon (e.g., having a <100> or <111> crystal orientation), although other suitable materials may be similarly employed, such as, but not limited to, germanium, silicon germanium, silicon carbide, gallium arsenide, gallium nitride, etc. Additionally, in one or more embodiments the substrate 602 is preferably modified by adding an impurity or dopant (e.g., boron, phosphorus, arsenic, etc.) to change a conductivity of the material (e.g., N-type or P-type). In the illustrative embodiment shown in FIG. 6A, the substrate 602 is of P-type conductivity and may thus be referred to as a P+ substrate (P+SUB). A P+ substrate may be formed by adding a P-species impurity or dopant (e.g., Group III elements, such as boron) of a prescribed concentration level, such as by using a diffusion or implant step, to change the conductivity of the material as desired. The doping level of the substrate 602 will depend on capacitance and/or breakdown requirements of the junction capacitor 600 and can be easily adjusted. In one or more embodiments, the doping level of the substrate 602 is in a range of about $10^{16}$ to $10^{19}$ atoms per cubic centimeter. In one or more alternative embodiments, an N-substrate may be formed by adding an N-type impurity or dopant (e.g., Group V elements, such as phosphorus) of a prescribed concentration level to the substrate material.

Figure 6B:
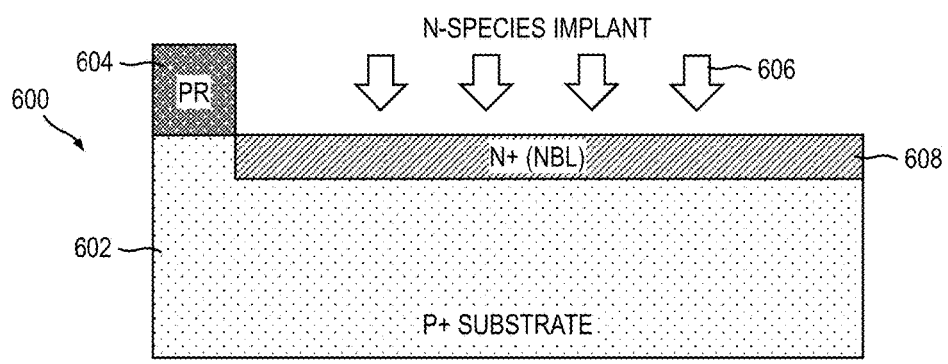

With reference now to FIG. 6B, a photosensitive material layer 604, referred to herein as a photoresist (PR) layer, is formed on at least a portion of an upper surface of the substrate 602. The wafer is then patterned, using standard photolithography techniques, and etched to form a PR mask. An opening is formed in the PR mask which will define a buried layer of the capacitor 600. The wafer is implanted with an N-type species 606, such as, for example, phosphorus (P), arsenic (As), antimony (Sb), or the like. Thermal anneal is then performed to activate the implant species. Areas of the wafer not protected by the PR 604 will form the buried layer 608. The PR is stripped from the wafer, using, for example, an etching step, to clean the upper surface of the wafer. As previously stated, the dose of the N-type implant depends on capacitance and breakdown requirements.

Figure 6C:
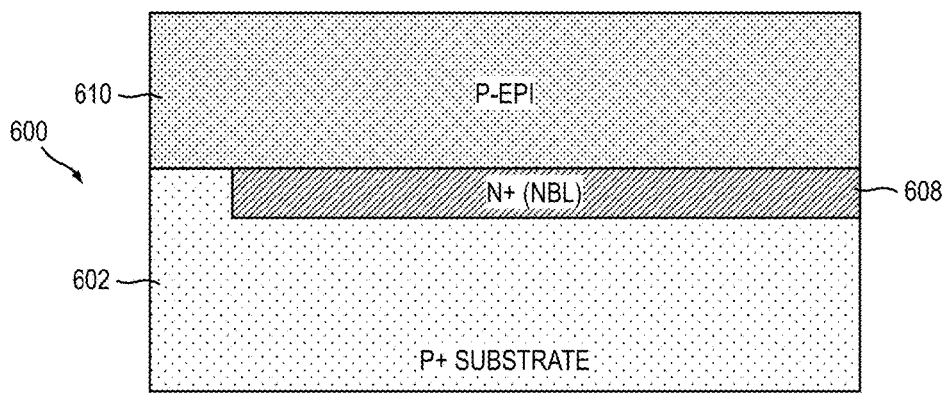

As shown in FIG. 6C, an epitaxial silicon layer 610 is formed on at least a portion of an upper surface of the substrate 602 covering the buried layer 608. In the illustrative embodiment shown, a P-type epitaxial layer (P-Epi) is formed, such as, for example, by performing an epitaxial growth process and then implanting a P-type impurity or dopant (e.g., boron (B), gallium (Ga), etc.) into the epitaxial layer to adjust the doping level as desired. The P-type epitaxial layer 610 in conjunction with the N-buried layer 608 forms the on-chip integrated P/N junction capacitor 600. The thickness of the epitaxial layer 610 can be in a range of about 2-6 µm, and is about 3-5 µm in a preferred embodiment.

Figure 6D:
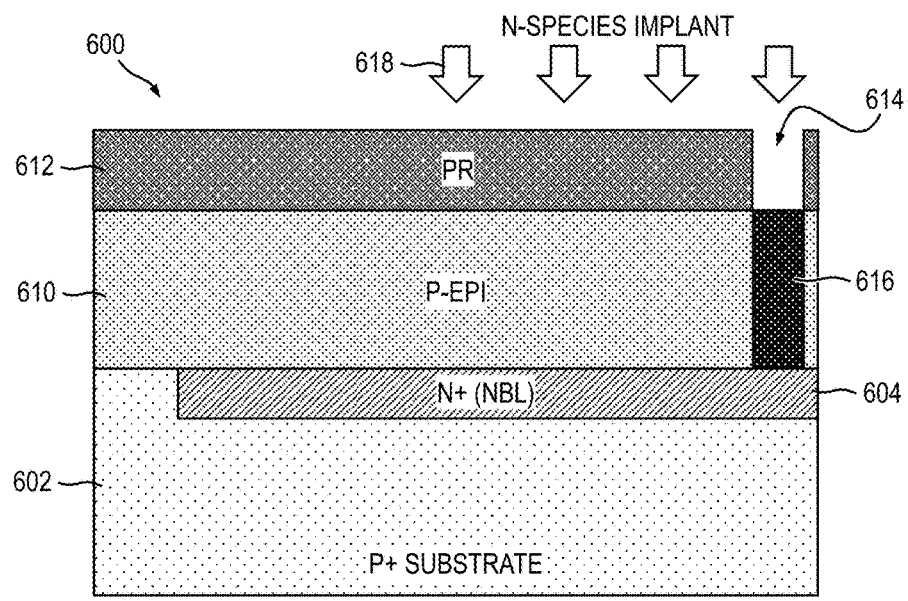
Figure 6E:
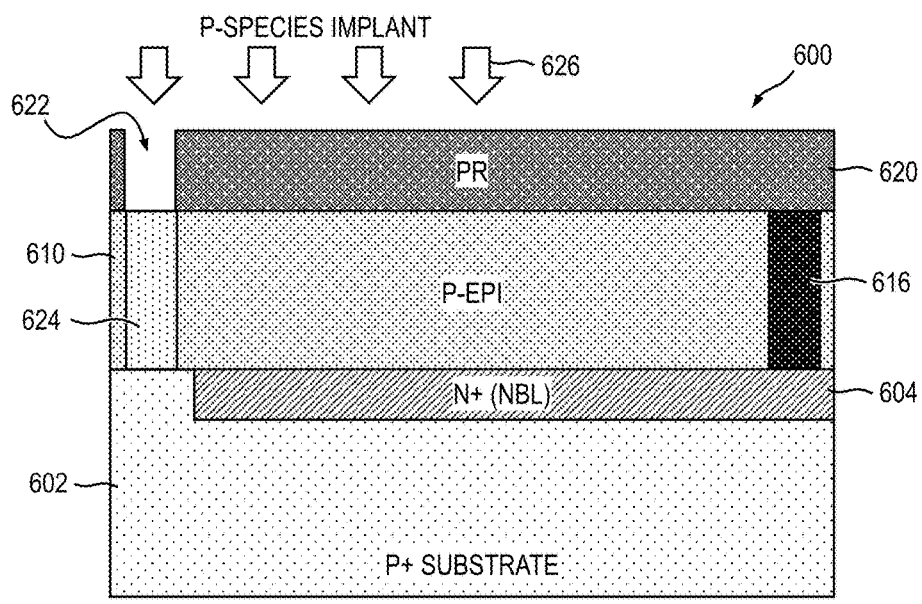

One or more complementary metal-oxide-semiconductor (CMOS) or power MOSFET devices are subsequently fabricated on at least a portion of the epitaxial layer 610. The N-side and P-side of the P/N junction can be connected to the surface through standard masking and implantation steps during the MOSFET fabrication processes, as shown in FIGS. 6D and 6E, respectively. Specifically, with reference to FIG. 6D, a photoresist (PR) layer 612 is formed on at least a portion of an upper surface of the epitaxial layer 610. An opening 614 is formed in the PR layer 612, for example using standard photolithographic patterning and etching, to define an N-side connection terminal 616 of the P/N junction capacitor 600. An N-species 618 is implanted, using an implant step, into the defined portion of the epitaxial layer 610 exposed by the opening 614. Thermal processing is subsequently performed to complete the N-side terminal 616, thereby forming an electrical connection to the N-side buried layer 604.

Similarly, FIG. 6E depicts formation of the P-side connection terminal. More particularly, a photoresist (PR) layer 620 is formed on at least a portion of an upper surface of the epitaxial layer 610. An opening 622 is formed in the PR layer 620, for example using standard photolithographic patterning and etching, to define a P-side connection terminal 624 of the P/N junction capacitor 600. A P-species 626 is implanted, using an implant step, into the defined portion of the epitaxial layer 610 exposed by the opening 622. Thermal processing is subsequently performed to complete the P-side terminal 624, thereby forming an electrical connection to the P-side epitaxial layer 610. Although not explicitly shown, the P-side of the junction capacitor 600 can also be connected through a back side of the wafer, in one or more embodiments.

In a power conversion application, such as, for example, a DC-to-DC converter embodiment, the N-side of the P/N junction is connected to an input terminal of the DC-to-DC convertor ($V_{IN}$ in FIG. 1) and the P-side of the P/N junction is connected to ground to form the junction capacitor ($C_{IN}$ in FIG. 1) coupled between the input terminal and ground. This junction capacitance will function to suppress the switching node ringing voltage present at a switching node of the converter, as previously explained in connection with FIG. 1. Since this P/N junction capacitor is buried under the power MOSFET device(s) and does not compete with the MOSFET for silicon surface area, it can significantly reduce the die size and achieve a smaller overall system form factor as compared to other capacitor formation schemes.

Given the discussion thus far, it will be appreciated that a power semiconductor device according to one or more embodiments of the invention includes a substrate of a first conductivity type, a buried layer of a second conductivity type formed in at least a portion of the substrate, and at least one epitaxial layer of the first conductivity type formed on at least a portion of an upper surface of the substrate and covering the buried layer. The epitaxial layer and the buried layer form a junction capacitor. The device further includes at least one active power transistor formed in an upper surface of the epitaxial layer and above at least a portion of the buried layer.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having active semiconductor devices integrated with passive components in accordance with one or more embodiments of the invention.

An integrated circuit in accordance with aspects of the present disclosure can be employed in essentially any application and/or electronic system where power semiconductor devices are employed (e.g., switching regulators, battery chargers, etc.). Suitable systems and devices for implementing embodiments of the invention may include, but are not limited to, power conversion systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A power semiconductor device for use in a power conversion circuit, the power semiconductor device comprising:
   a substrate of a first conductivity type;
   a buried layer of a second conductivity type formed in at least a portion of the substrate, at least a portion of an upper surface of the buried layer being adjacent to and coplanar with at least a portion of an upper surface of the substrate;
   at least one epitaxial layer of the first conductivity type formed at least on the portion of the upper surface of the substrate and the portion of the upper surface of the buried layer, the epitaxial layer and the buried layer forming a junction capacitor; and
   at least first and second power transistors formed in an upper surface of the epitaxial layer and above at least a portion of the buried layer, the first and second power transistors being spaced laterally from one another by at least one dielectric isolation structure formed between the first and second power transistors;
   wherein the first power transistor is electrically coupled with the junction capacitor and an input of the power conversion circuit, and the second power transistor is electrically coupled with an output of the power conversion circuit.

2. The device of claim 1, wherein the buried layer comprises a trenched structure configured to increase an effective area of a P/N junction formed between said buried layer and the at least one epitaxial layer, and thereby increase a capacitance density of the junction capacitor.

3. The device of claim 1, further comprising:
   a first conductive sinker formed through the at least one epitaxial layer for providing electrical connection with the buried layer, the first conductive sinker forming a first terminal of the junction capacitor; and
   a second conductive sinker formed at least partially through the at least one epitaxial layer for providing electrical connection with the epitaxial layer, the second conductive sinker forming a second terminal of the junction capacitor.

4. The device of claim 3, wherein the first conductive sinker comprises material of the second conductivity type and the second conductive sinker comprises material of the first conductivity type.

5. The device of claim 3, wherein the first conductive sinker is formed between two adjacent active power transistors formed in the upper surface of the epitaxial layer.

6. The device of claim 1, wherein at least one of the at least first and second power transistors comprises at least one metal-oxide-semiconductor field-effect transistor.

7. The device of claim 1, further comprising at least one well formed in the upper surface of the epitaxial layer and above at least a portion of the buried layer, the at least one active power transistor being formed within the at least one well.

8. The device of claim 1, further comprising a plurality of wells formed in the upper surface of the epitaxial layer and above at least a portion of the buried layer, each of the plurality of wells being electrically isolated from one another and including at least one active power transistor formed therein.

9. The device of claim 8, wherein laterally adjacent wells are electrically isolated from one another by a dielectric region formed in the upper surface of the epitaxial layer.

10. The device of claim 1, wherein respective doping levels of the buried layer and the at least one epitaxial layer used to fabricate the junction capacitor are configured to maximize a capacitance of the junction capacitor.

11. The device of claim 1, further comprising at least one conductive sinker connected with the buried layer, the conductive sinker being formed vertically through the at least one epitaxial layer and passing through the isolation structure for providing electrical connection with the buried layer from the upper surface of the device.

12. A method of forming a power semiconductor device for use in a power conversion circuit, the method comprising:
forming a substrate of a first conductivity type;
forming a buried layer of a second conductivity type in at least a portion of the substrate, at least a portion of an upper surface of the buried layer being adjacent to and coplanar with at least a portion of an upper surface of the substrate;
forming at least one epitaxial layer of the first conductivity type at least on the portion of the upper surface of the substrate and the portion of the upper surface of the buried layer, the epitaxial layer and the buried layer forming a junction capacitor;
forming at least first and second power transistors in an upper surface of the epitaxial layer and above at least a portion of the buried layer, the first and second power transistors being spaced laterally from one another; and
forming at least one dielectric isolation structure between the first and second power transistors;
wherein the first power transistor is electrically coupled with the junction capacitor and an input of the power conversion circuit, and the second power transistor is electrically coupled with an output of the power conversion circuit.

13. The method of claim 12, wherein forming the buried layer comprises:
forming a plurality of trenches in the buried layer; and
forming the at least one epitaxial layer in the trenches of the buried layer to increase an effective area of a P/N junction formed between said buried layer and the at least one epitaxial layer, thereby increasing a capacitance density of the junction capacitor.

14. The method of claim 13, further comprising controlling a capacitance density of the junction capacitor by controlling at least one of a depth and a pitch of each of at least a subset of the trenches in the buried layer.

15. The method of claim 12, further comprising forming at least one well in the upper surface of the epitaxial layer and above at least a portion of the buried layer, the at least one active power transistor being formed within the at least one well.

16. The method of claim 12, further comprising forming a plurality of wells in the upper surface of the epitaxial layer and above at least a portion of the buried layer, each of the plurality of wells being electrically isolated from one another and including at least one active power transistor formed therein.

17. The method of claim 12, further comprising:
forming a first conductive sinker through the at least one epitaxial layer for providing electrical connection with the buried layer, the first conductive sinker forming a first terminal of the junction capacitor; and
forming a second conductive sinker at least partially through the at least one epitaxial layer for providing electrical connection with the epitaxial layer, the second conductive sinker forming a second terminal of the junction capacitor.

18. A power semiconductor device, comprising:
a substrate of a first conductivity type;
a buried layer of a second conductivity type formed in at least a portion of the substrate, at least a portion of an upper surface of the buried layer being adjacent to and coplanar with at least a portion of an upper surface of the substrate;
at least one epitaxial layer of the first conductivity type formed at least on the portion of the upper surface of the substrate and the portion of the upper surface of the buried layer, the epitaxial layer and the buried layer forming a junction capacitor;
at least a first well of the first conductivity type formed in the at least one epitaxial layer proximate an upper surface of the epitaxial layer and above at least a portion of the buried layer; and
at least a first power transistor formed in the first well, the first power transistor including source and drain regions formed in the upper surface of the epitaxial layer and spaced laterally from one another, and a lightly-doped drain region formed in the upper surface of the epitaxial region between the source and drain regions;
wherein at least the first power transistor is electrically coupled with the junction capacitor and a power conversion circuit.

19. The power semiconductor device of claim 18, wherein at least the first power transistor is electrically coupled with an input of the power conversion circuit.

20. A power semiconductor device, comprising:
a substrate of a first conductivity type;
a buried layer of a second conductivity type formed in at least a portion of the substrate, at least a portion of an upper surface of the buried layer being adjacent to and coplanar with at least a portion of an upper surface of the substrate;
at least one epitaxial layer of the first conductivity type formed at least on the portion of the upper surface of the substrate and the portion of the upper surface of the buried layer, the epitaxial layer and the buried layer forming a junction capacitor;
at least a first well of the first conductivity type formed in the at least one epitaxial layer proximate an upper surface of the epitaxial layer and above at least a portion of the buried layer;
at least a first power transistor formed in the first well, the first power transistor including source and drain regions formed in the upper surface of the epitaxial layer and spaced laterally from one another, and a lightly-doped drain region formed in the upper surface of the epitaxial region between the source and drain regions; and
at least a second well of the first conductivity type formed in the at least one epitaxial layer proximate the upper surface of the epitaxial layer and above at least another portion of the buried layer, the first and second wells being spaced laterally from one another by at least one dielectric isolation structure formed between the first and second wells.

21. The power semiconductor device of claim 20, further comprising at least a second power transistor formed in the second well, the second power transistor including source and drain regions formed in the upper surface of the epitaxial layer and spaced laterally from one another, and a lightly-doped drain region formed in the upper surface of the epitaxial region between the source and drain regions.

22. The power semiconductor device of claim 21, wherein the first power transistor is electrically coupled with the junction capacitor and an input of a power conversion circuit, and the second power transistor is electrically coupled with an output of the power conversion circuit.

\* \* \* \* \*